United States Patent
Sakuma et al.

(10) Patent No.: US 8,198,193 B2
(45) Date of Patent: Jun. 12, 2012

(54) MANUFACTURING METHOD OF SEMICONDUCTOR SUBSTRATE

(75) Inventors: Naoshi Sakuma, Kanagawa (JP); Tadashi Sakai, Kanagawa (JP); Yuichi Yamazaki, Tokyo (JP); Masayuki Katagiri, Kanagawa (JP); Mariko Suzuki, Kanagawa (JP); Makoto Wada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/041,543

(22) Filed: Mar. 7, 2011

(65) Prior Publication Data

US 2012/0052680 A1 Mar. 1, 2012

(30) Foreign Application Priority Data

Aug. 25, 2010 (JP) ................... 2010-188836

(51) Int. Cl.
*H01L 21/4763* (2006.01)
(52) U.S. Cl. ............... 438/637; 438/128; 257/E21.575
(58) Field of Classification Search ............... 438/641; 257/E21.536
See application file for complete search history.

(56) References Cited

U.S. PATENT DOCUMENTS

2006/0170008 A1* 8/2006 Konishi .................. 257/236
2008/0237858 A1 10/2008 Nihei
2008/0245553 A1 10/2008 Sakai et al.

FOREIGN PATENT DOCUMENTS

JP 2008-258187 10/2008
JP 4364253 11/2009

OTHER PUBLICATIONS

Sunwoo Lee, et al. "Carbon Nanotube Interconnection and Its Electrical Properties for Semiconductor Applications", Japanese Journal of Applied Physics, vol. 48, 2009, pp. 1-4.

* cited by examiner

*Primary Examiner* — Cheung Lee
(74) *Attorney, Agent, or Firm* — Oblon, Spivak, McClelland, Maier & Neustadt, L.L.P.

(57) ABSTRACT

A manufacturing method of a semiconductor substrate includes the following steps:
forming a first wiring layer on a substrate;
forming an interlayer insulating film having a via hole on the wiring layer;
forming carbon nanotubes in the via hole;
performing a fluorination treatment entirely to the substrate;
forming an embedded film in the via hole having the carbon nanotubes therein; and
polishing the substrate to entirely flatten the substrate.

9 Claims, 10 Drawing Sheets

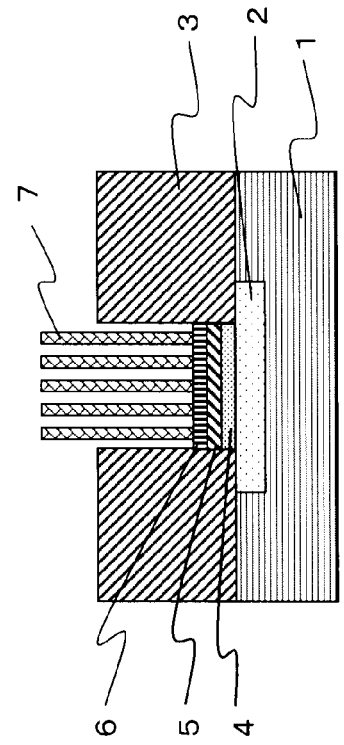
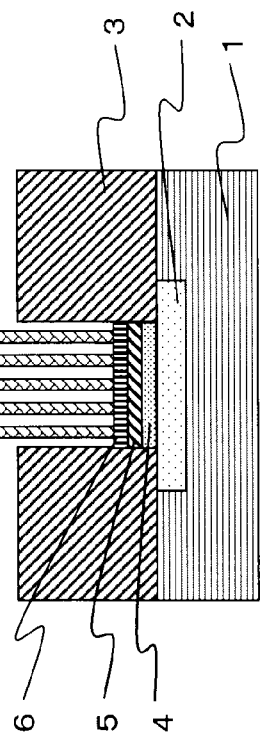
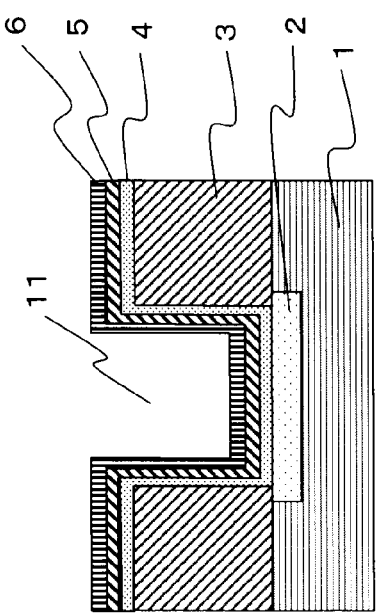
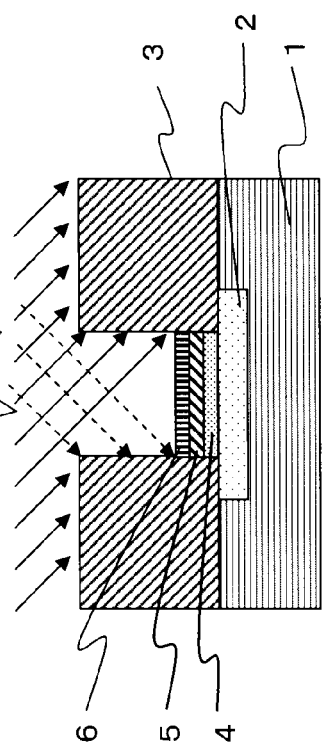
FIG. 1A
FIG. 1B
FIG. 1C
FIG. 1D

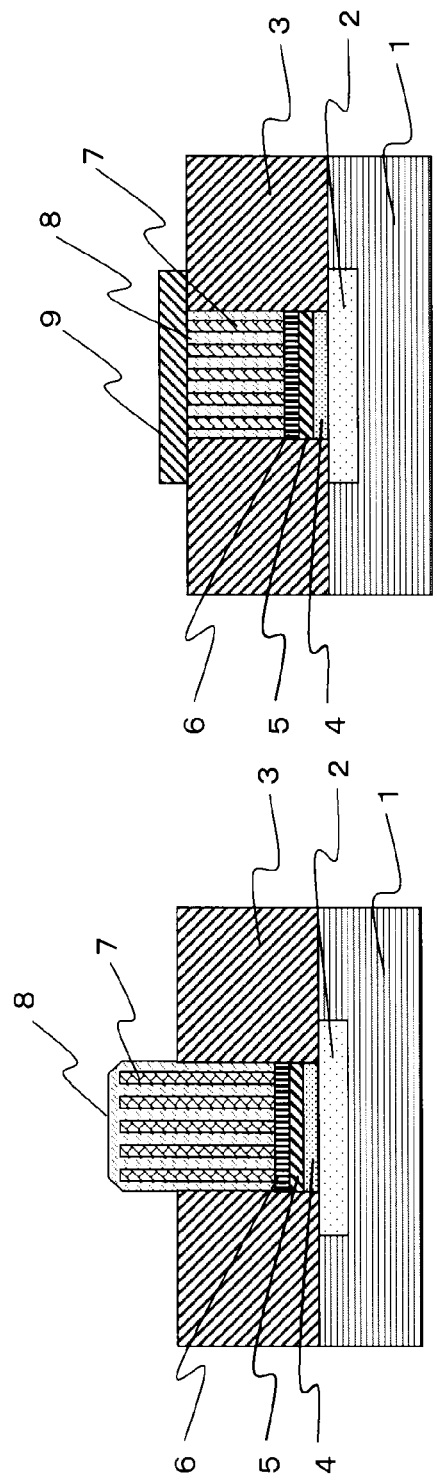
FIG. 1E
FIG. 1F
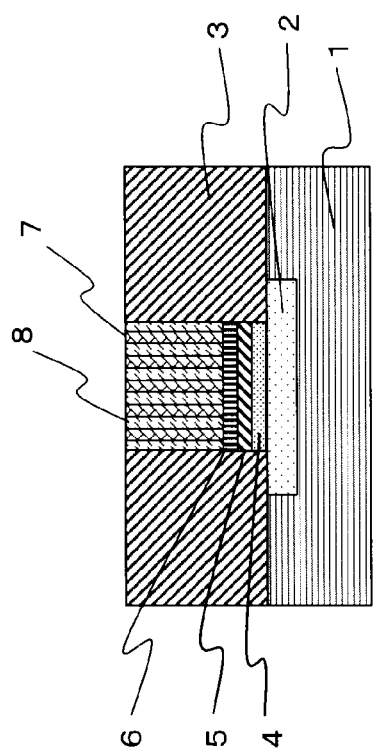
FIG. 1G

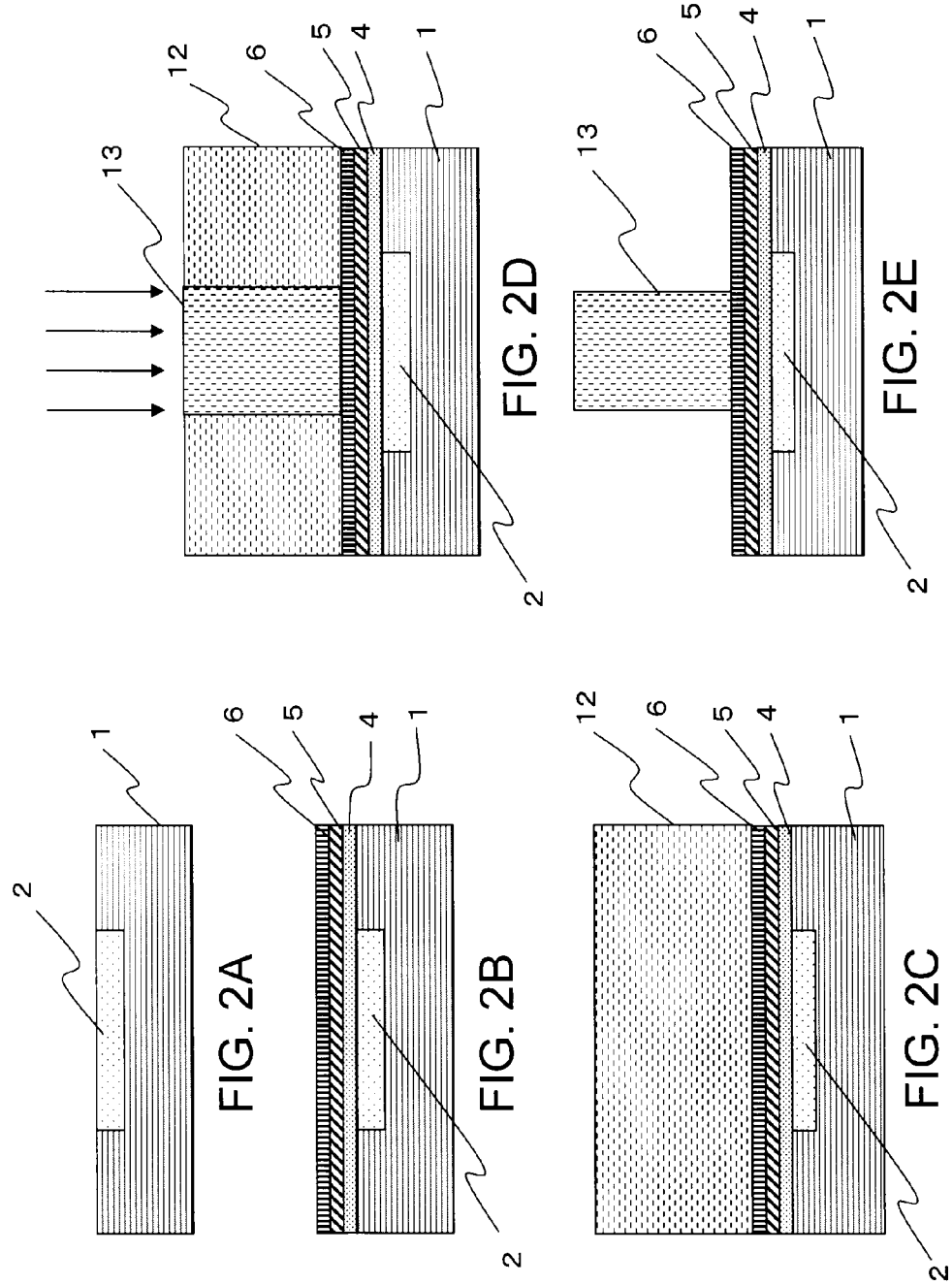

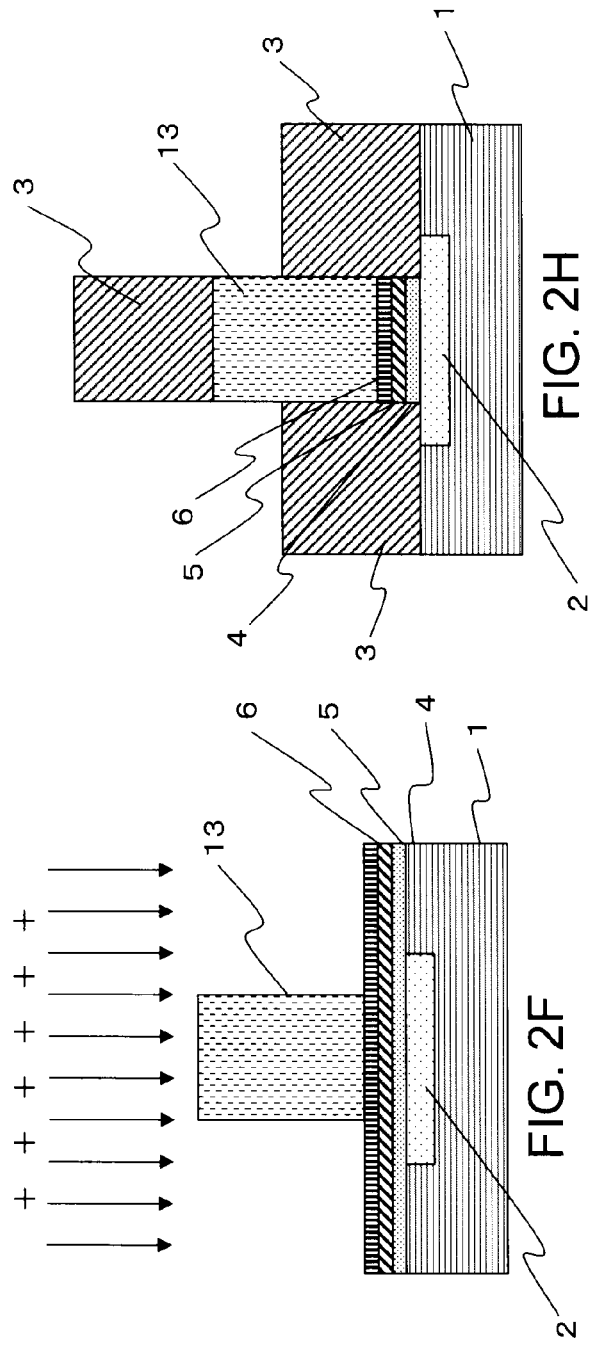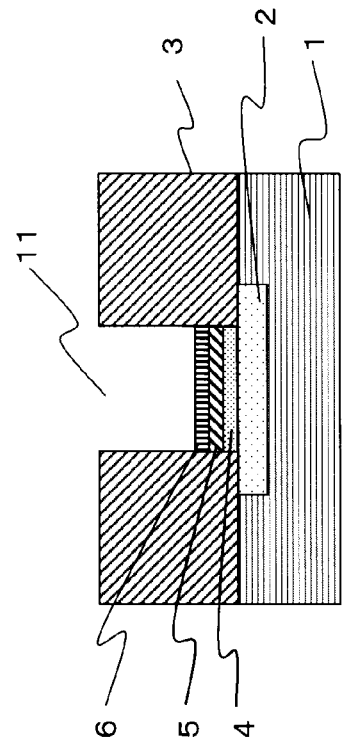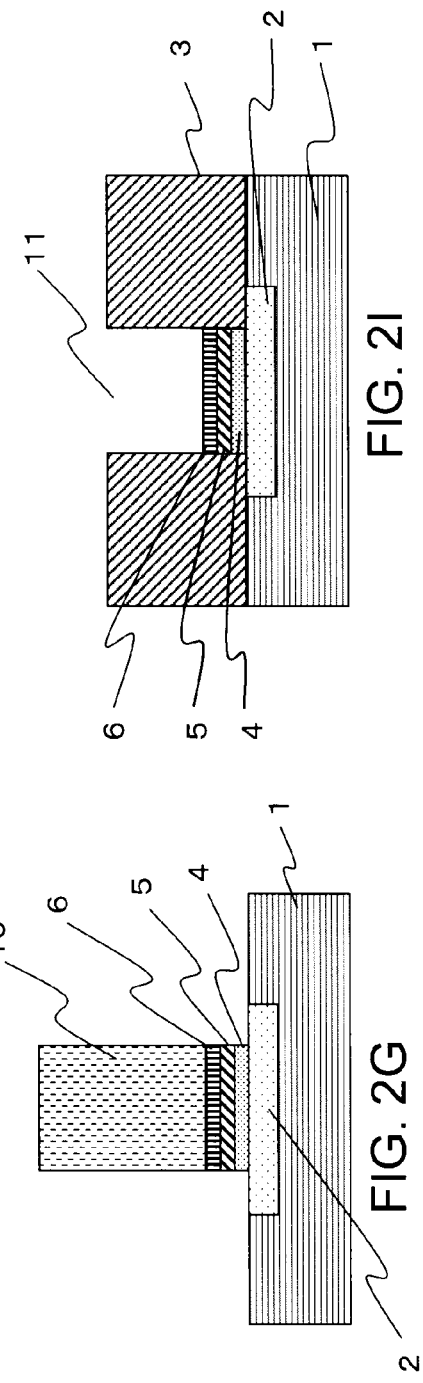

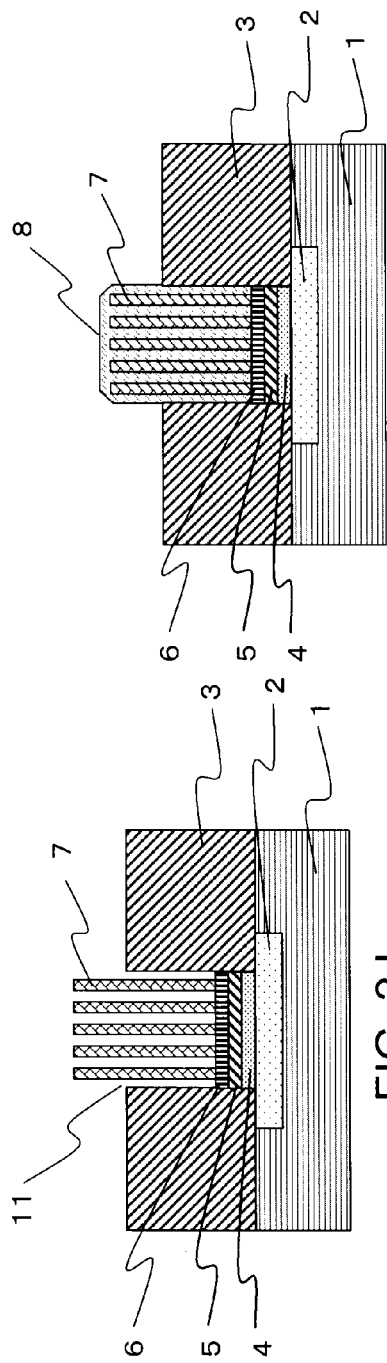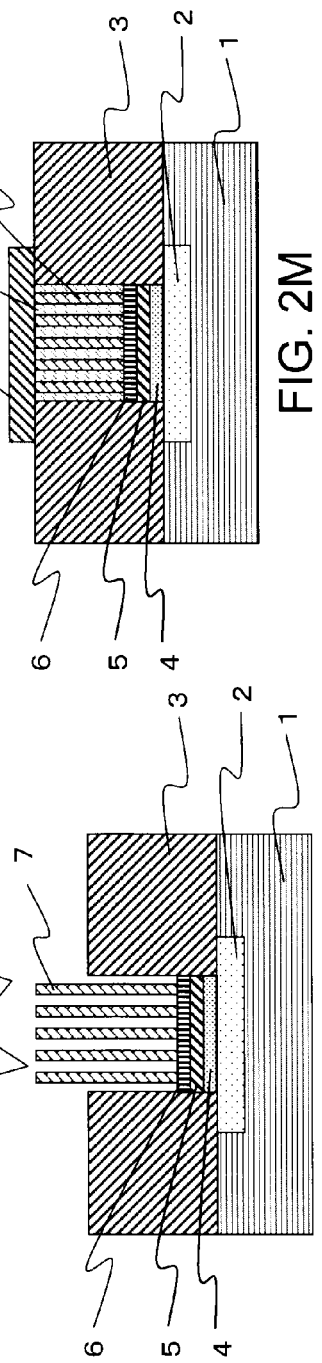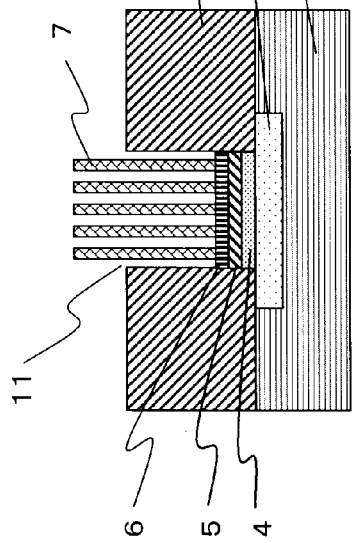

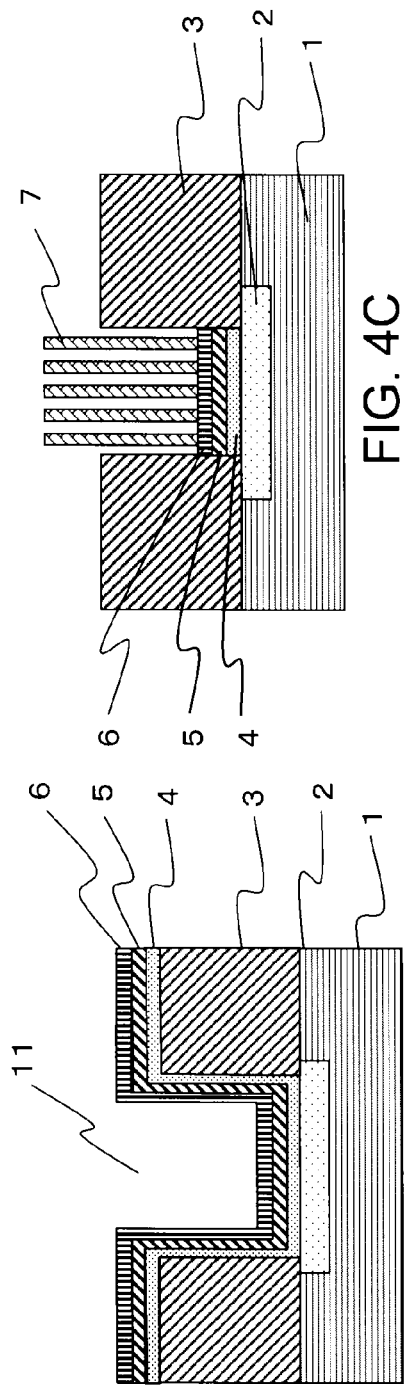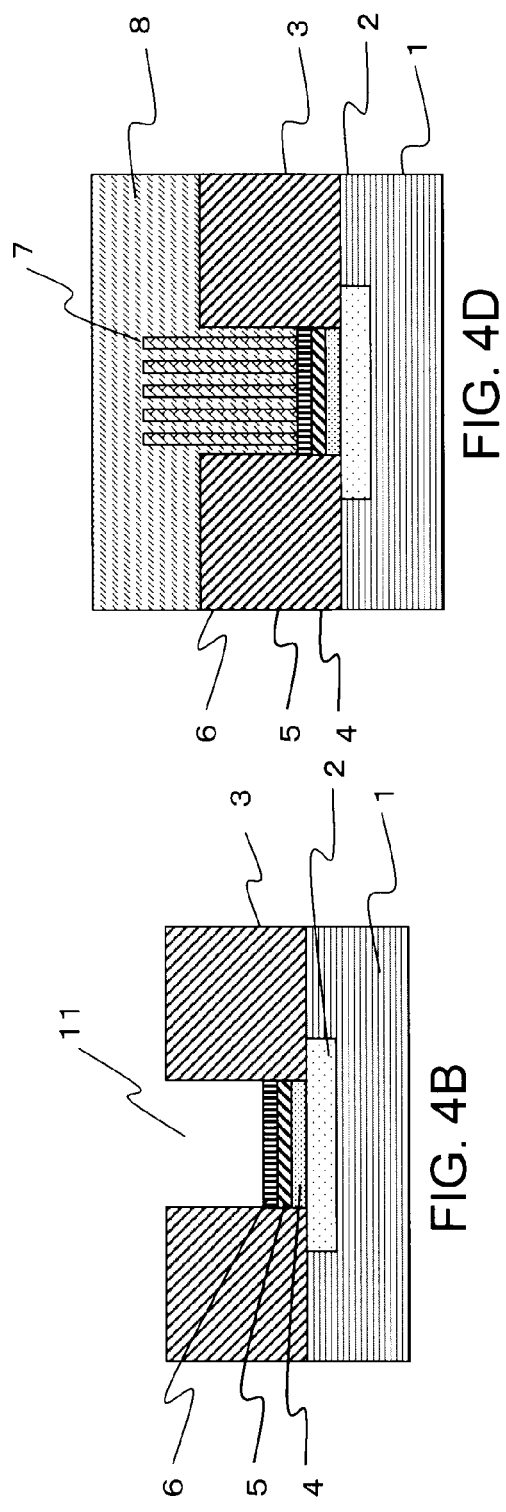

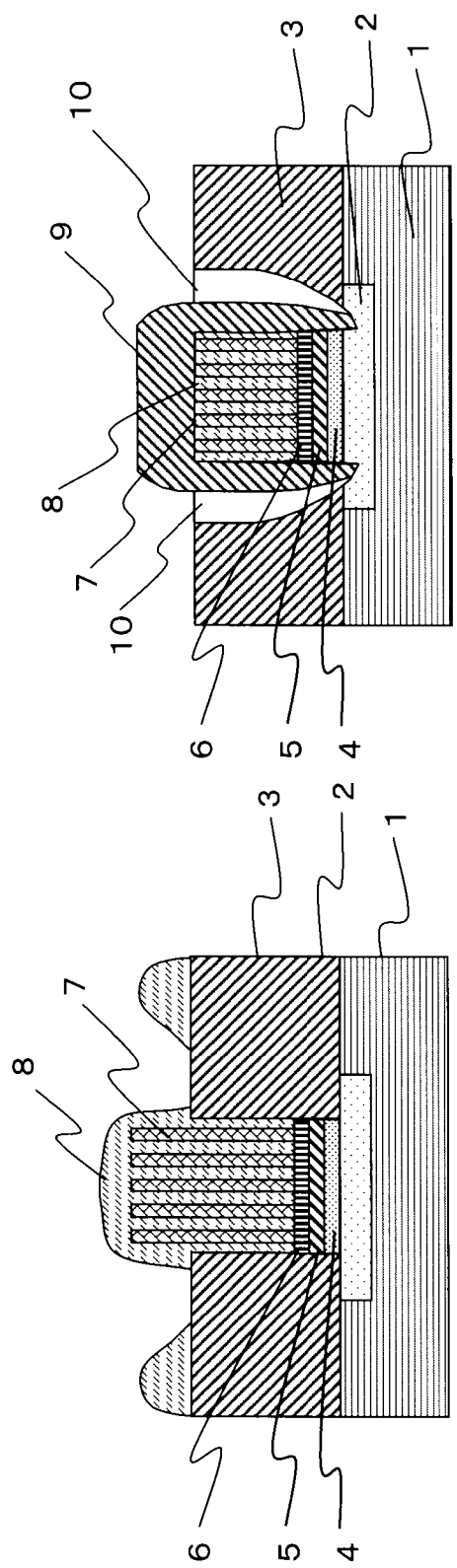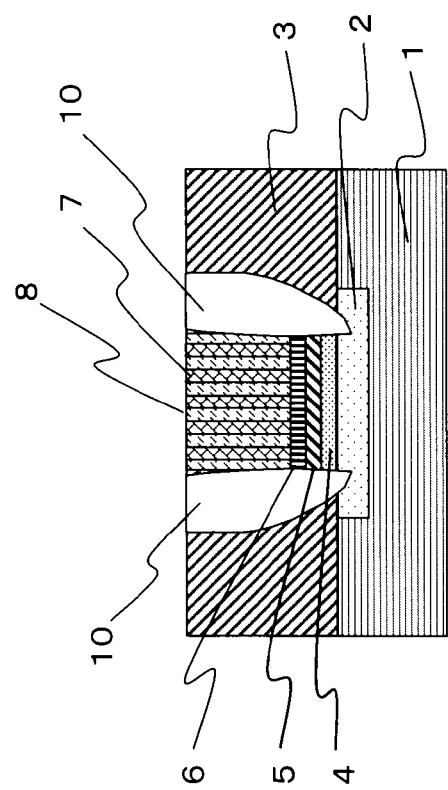

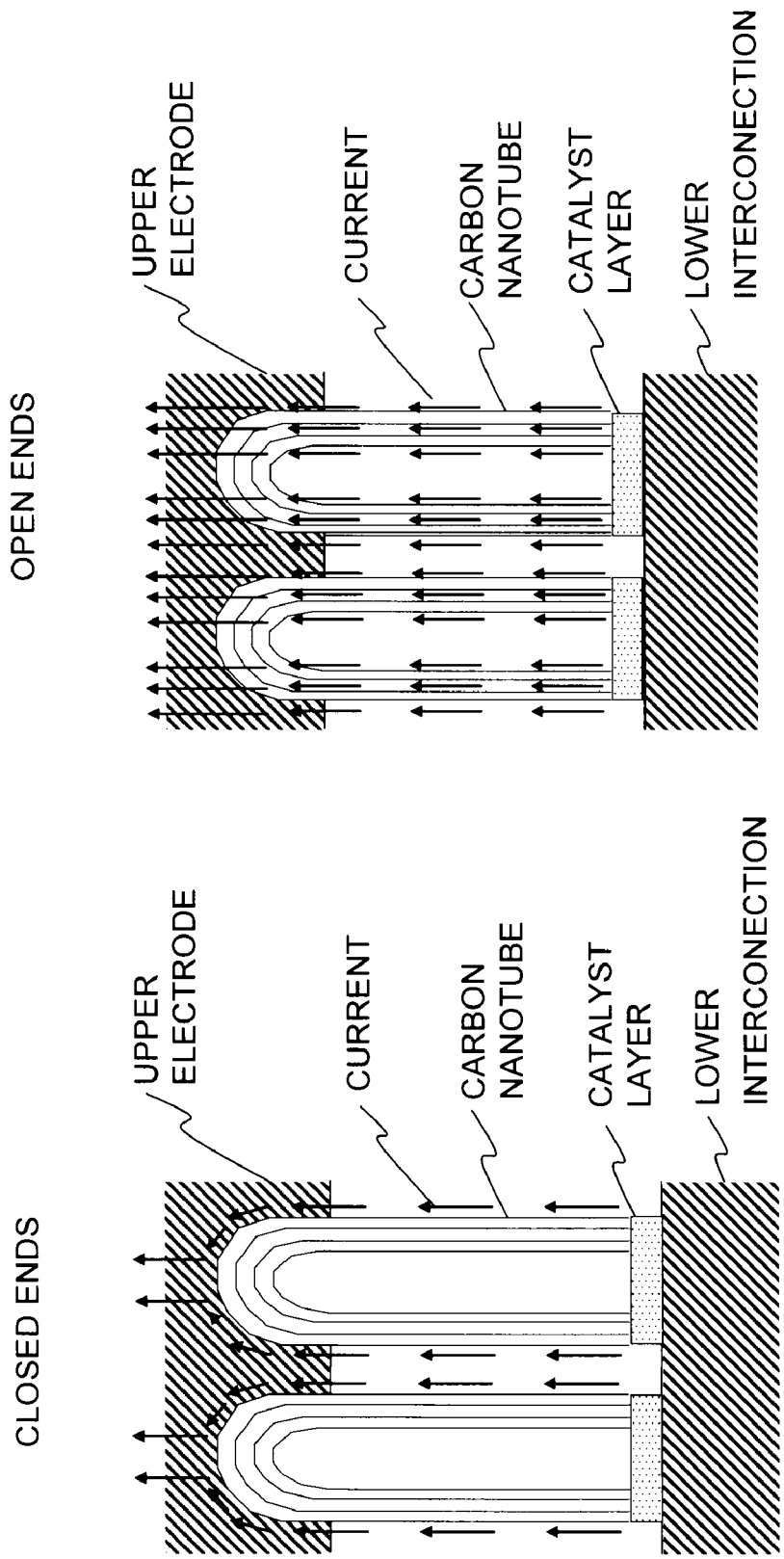

MANUFACTURING METHOD OF SEMICONDUCTOR SUBSTRATE

CROSS REFERENCE TO RELATED APPLICATION

This application is based upon and claims the benefit of priority from the prior Japanese Patent Application No. 2010-188836, filed on Aug. 25, 2010, the entire contents of which are incorporated herein by reference.

FIELD

Embodiments basically relate to a manufacturing method of a semiconductor substrate in which carbon nanotube is used as via wiring.

BACKGROUND

Involved in the miniaturization of LSIs, wiring is also miniaturized much progressively. Copper to be used as a wiring material at present is approaching its limit of the withstanding current density in the wiring miniaturization, and it is expected to employ a new material for wiring. A carbon nanotube (CNT) has a high current density and is easily grown on a nanoscale. Therefore, a CNT is one of the materials which are regarded as a next-generation wiring material.

There have been several manufacturing methods for CNT via wiring. One of the conventional methods is to provide the CNT via wiring by growing CNTs only in via holes to be described with reference to FIGS. 4A and 5C.

FIGS. 4A to 4F are views showing manufacturing steps of the CNT via wiring according to one of the conventional methods As shown in the figures, it is structured such that a lower wiring layer (first wiring layer) 2 is formed in a semiconductor substrate 1 including semiconductor devices such as a transistor or a capacitor, and an interlayer insulating film 3 having a via hole 11 is formed thereon to connect the lower wiring layer 2 to an upper electrode 9. The first step to the step to form the via hole 11 are not fundamentally different from conventional LSI wiring steps. After the via hole 11 is formed in the interlayer insulating film 3, a metal barrier layer 4, e.g., a tantalum nitride (TaN) layer is formed. Next, catalyst layers 5, 6 which are important for growing CNTs, such as titanium nitride (TiN) or cobalt (Co), are formed sequentially. In growing CNTs, it is possible to use only one catalyst layer 6 (FIG. 4A).

Next, in order to grow CNTs only inside the via hole, the catalyst layers in a region except the via hole (here, called a "field region" of the substrate) are removed (FIG. 4B). In order to remove the catalyst layers from the field region, argon (Ar) ion oblique milling is carried out. Next, CNTs are grown using a plasma CVD method. In this case, the catalyst layers are removed from the field region as shown in FIG. 4C, thereby allowing it to grow CNTs 7 only inside the via hole 11. After the growth of CNTs 7, it is possible to flatten the surface of the substrate having multiwalled carbon nanotubes (MW (multiwalled) CNTs) to make the inner layers (graphen sheets) of the MWCNTs 7 contribute to electric conduction. In case that the upper electrode is formed directly on MWCNTs 7, only the outermost CNT layers contribute to the conduction as shown in FIG. 6A ("closed ends") In such a case, the CNTs 7 cannot serve sufficiently as via wiring. Consequently, chemical mechanical polishing (CMP) is performed on the entire substrate to entirely flatten the substrate for "open ends" of MWCNTs 7.

That is, the tip portions of MWCNTs 7 are also cut with CMP, and an upper electrode is formed on the MWCNTs 7 whose tip portions are cut. Thereby, the inner CNT layers (graphen sheets) of MWCNTs 7 can also contribute to the conduction to electrically connect the upper and lower electrodes to each other, as shown in FIG. 6B ("open ends"). In the conventional example, before performing CMP, an embedded film 8 is formed in the via hole shown in FIG. 4D to fix MWCNTs 7 included in the via hole 11. Silicon oxide (SiO$_2$) series) films, such as SOG (Spin On Glass), are used for the embedded film 8. After performing CMP (FIG. 4E), the upper electrode 9 is formed as shown in FIG. 4F.

The above-described is the manufacturing process of CNT via wiring according to the conventional example. When the via wiring is manufactured according to the manufacturing process mentioned above, the embedded film 8 shown in FIG. 4D is not uniformly provided to the substrate, and a region lacking the embedded film 8 may be easily formed around the via hole 11, as shown in FIG. 5A. If CMP is performed under such a condition, the region lacking the embedded film 8 is polished faster than the other region having embedded film 8 thereon to give rise to a deeply and non-uniformly polished region 10 as shown in FIG. 5B. Thereby, an undesirable phenomenon is caused that the polishing develops to undesirably reach the lower wiring layer 2 around the via hole 11 as shown in FIG. 5B. When the upper electrode 9 is formed under such a condition shown in FIG. 5B, the lower wiring layer 2 and the upper electrode 9 may short out as shown in FIG. 5C. Accordingly, the via hole filled with CNTs 7 does not serve as wiring any more.

As described above, SOG is applied to the substrate having the interlayer insulating film 3 including the via hole filled with CNTs 7 therein, but is often applied not uniformly. Therefore, a region without uniform coating of SOG often appears as shown in FIG. 5A. The field region is also exposed to plasma when growing CNTs 7. The plasma is considered to chemically modify the surface of the region or to change the surface shape of the region. Such a surface of the field region undergoes CMP to be polished non-uniformly as shown in FIG. 5B. As a result, the interlayer insulating film 3 is locally polished, thereby causing an unintended hole to be formed around CNTs 7. An upper electrode is formed on the surface of the field region mentioned above to likely cause the upper electrode and the lower layer wiring 2 to short out. Under such a condition, the CNT via wiring does not serve as wiring any more.

BRIEF DESCRIPTION OF DRAWINGS

Aspects of this disclosure will become apparent upon reading the following detailed description and upon reference to accompanying drawings. The description and the associated drawings are provided to illustrate embodiments of the invention and not limited to the scope of the invention.

FIGS. 1A to 1F are views each showing manufacturing steps of a semiconductor substrate according to a first embodiment.

FIG. 1G is a schematic view showing a manufacturing step where carbon nanotubes fill a via wiring with an embedded film and an upper electrode is formed on the carbon nanotubes, which have been flattened, according to the first embodiment.

FIGS. 2A to 2L are views showing manufacturing steps of a semiconductor substrate according to a second embodiment.

FIG. 2M is a view showing an entire substrate to be completed according to the second embodiment.

FIGS. 4A to 4F are views showing manufacturing steps of the CNT via wiring according to a conventional example.

FIGS. 5A to 5C are views showing manufacturing steps giving rise to an undesirable phenomenon in the conventional example so that a lower wiring layer and an upper electrode may short out.

FIGS. 6A and 6B are views illustrating open ends and closed ends of carbon nanotubes.

DESCRIPTION

Figure 3:
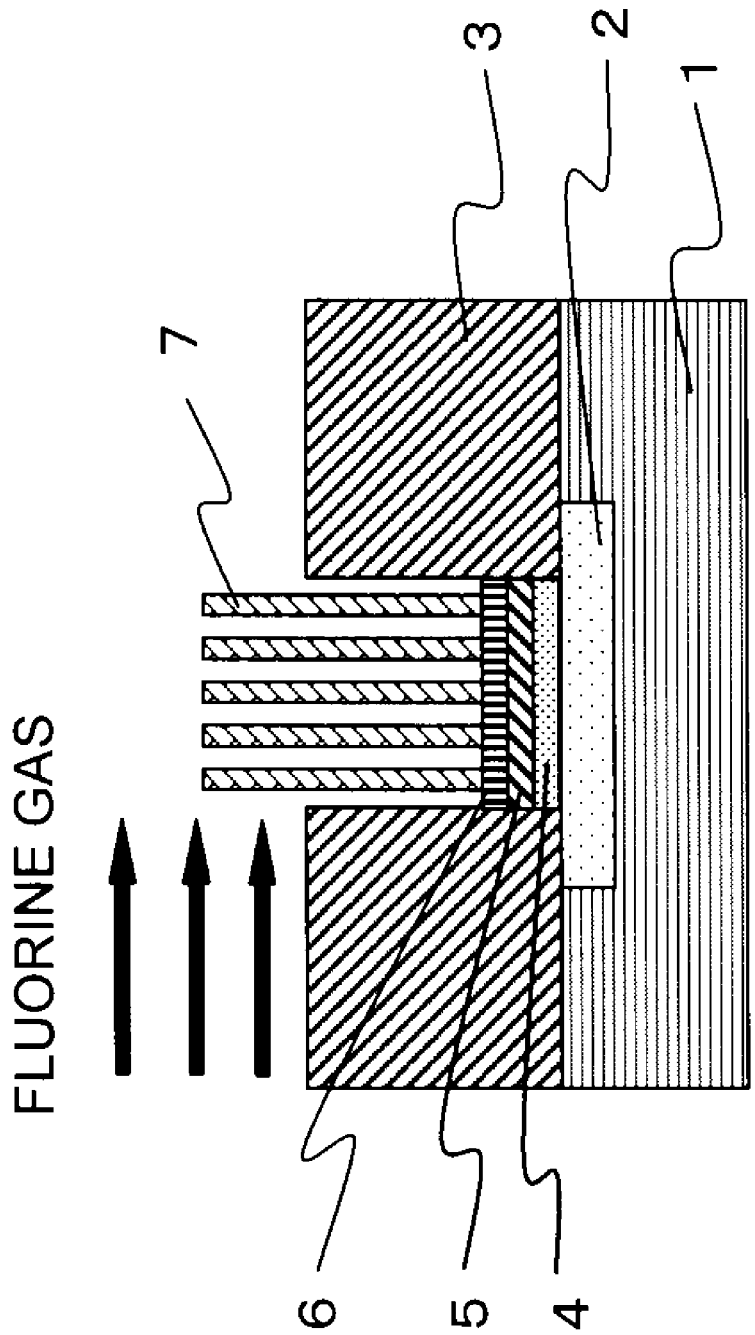
FIG. 3 is a schematic view showing a manufacturing step where a spray or a flow of fluorine system gases to fluorinate the surface of the substrate, according to a third embodiment.
Figure 4E:
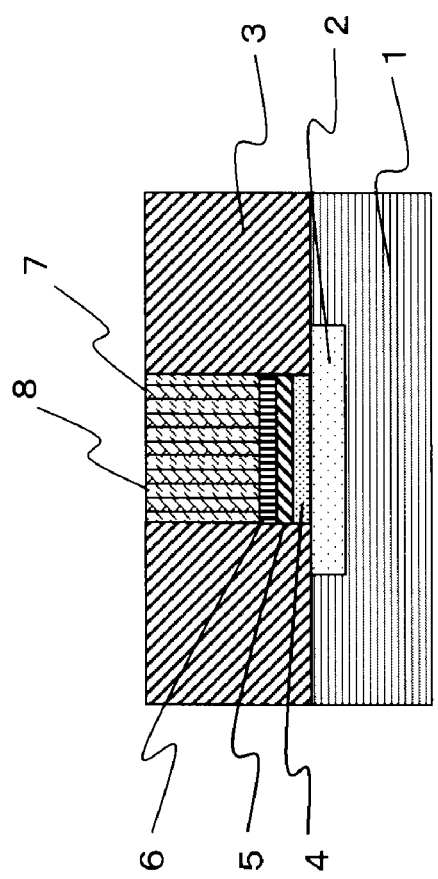
Figure 4F:
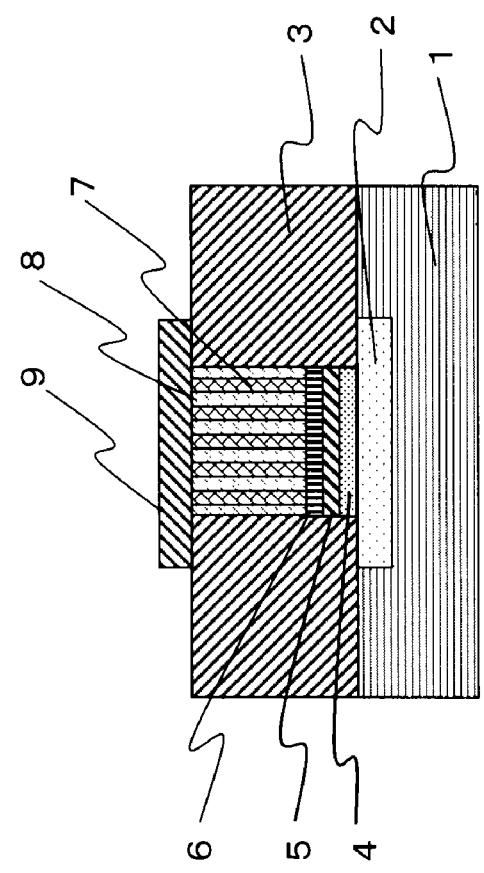

As will be described below, according to a first embodiment, a manufacturing method of a semiconductor substrate includes the following steps:
forming a first wiring layer on a substrate;
forming an interlayer insulating film having a via hole on the wiring layer;
forming carbon nanotubes in the via hole;
performing a fluorination treatment entirely to the substrate;
forming an embedded film in the via hole having the carbon nanotubes therein; and
polishing the substrate to entirely flatten the substrate.

Embodiments will be explained below with FIGS. 1A to 3. The same reference numerals denote the same parts. All the figures are schematic views for illustrating the embodiments of the invention. The shapes, dimension ratios, etc. may differ from actual models. The shapes or dimension ratios may be subjected to design changes with reference to the following descriptions and publicly known techniques.

First Embodiment

A first embodiment will be described below with reference to FIGS. 1A to 1G.

FIGS. 1A to 1F are views each showing manufacturing steps of a semiconductor substrate according to a first embodiment.

FIG. 1A is a view showing a step to prepare a structure of a semiconductor substrate 1 to be preliminarily provided with semiconductor devices, such as a transistor and a capacitor, etc. A lower wiring layer 2 (first wiring layer), an interlayer insulating film 3 with a via hole 11, a metal barrier layer 4, and catalyst layers 5, 6 formed on an interlayer insulating film 3. The via hole 11 is to connect the lower wiring layer 2 to an upper wiring layer 9 (not shown). Steps to forming the via hole 11 follow a conventional method of LSI wiring. The interlayer insulating film 3 is formed after the lower wiring layer 2 is formed on the semiconductor substrate 1. A silicon oxide film (SiOC film) including carbon is used for the interlayer insulating film 3, for example. This SiOC film may include pores so that a dielectric constant thereof is reduced.

A tetraethoxysilane (TEOS) gas is employed to form a $SiO_2$ film with a plasma CVD method when the $SiO_2$ film is used for the interlayer insulating film 3. Next, a protective film so called a "cap layer" (not shown) is formed on the SiOC film, i.e., the interlayer insulating film 3 to prevent damages due to post-processing such as etching and CMP. A silicon oxide film ($SiO_2$) is used for the cap layer. When an SiOC film including no pores is used for the interlayer insulating film 3, the cap layer is not needed to be formed particularly.

Next, the via hole 11 is formed through the interlayer insulting film 3. A dry etching method using plasma, so called "reactive ion etching", or a wet etching method using chemical solution, etc. is used to form the via hole 11. After forming the via hole 11 through the interlayer insulting film 3, a contact layer employing a conducting material such a single metal, e.g., tungsten (W), copper (Cu) and aluminum (Al) is inserted in order to be in contact with the lower layer wiring 2.

In addition, the barrier metal layer 4 is inserted in the present embodiment in order to prevent the diffusion of the metal included in the contact layer which is conductive. In the present embodiment, a TaN layer is formed as the barrier metal layer 4 using a sputtering method. Materials to be used for the barrier metal layer 4 include tantalum (Ta), titanium (Ti), ruthenium (Ru), manganese (Mn), cobalt (Co) and their nitrides, for example.

Next, CNTs 7 are grown as a material for via wiring to fill the via hole 11 therewith. The catalyst layers 5 and 6 to be needed for the growth of CNTs 7 are sequentially formed. Materials of the catalyst layers 5, 6 include titanium nitride (TiN) and cobalt (Co), respectively. Although CNTs 7 can grow only on the catalyst layer 6, the auxiliary catalyst layer can be inserted under the catalyst layer 6 to assist the growth of CNTs 7. The catalyst layer is not limited to the laminated structure of the catalyst layer 6 and the catalyst layer 5, but may be a structure of Co/Ti, Co/Ta, Ni/TiN, or Ni/Ta, for example. Or, a single layer, such as a Co layer, a Ni layer or the like, may be employed. The manufacturing method of the catalyst layers is not limited to a sputter method, but may be different methods such as a vacuum deposition method, provided that the methods do not detract the catalyst action thereof.

Before CNTs 7 grow on the bottom face of the via hole, the catalyst layer is so thin that the catalyst layer is a discontinuous film including islands in most cases. In case that the catalyst layer is a continuous film, the catalyst layer is exposed to plasma, or undergoes instantaneous heating to make the continuous film a discontinuous catalyst layer including islands. Thereby, columnar CNTs 7 grow inside the via hole perpendicularly to the bottom face of the via hole.

Next, as shown in FIG. 1B, in order to grow CNTs 7 only in the via hole, the catalyst layers 5, 6 are removed in a region except the via hole 11 (here, the region called a "field region" below). Ar ion milling is used to remove the catalyst layers 5, 6 from the field region in the present embodiment. In the milling, Ar ions are directed obliquely to the substrate 1, and the incident angle of Ar ions is set so that the Ar ions are incident on the field region and the side wall of the via hole 11, which is perpendicular to the substrate 1, while rotating the substrate 1. FIG. 1B is a view showing a manufacturing step when the catalyst layers 5, 6 have been just removed from the field region except the via hole 11. The method of removing the catalyst layers 5, 6 from the field region is not limited to the above-mentioned, but any method may be used, provided that the catalyst layers are left only on the bottom face of the via hole 11.

Next, as shown in FIG. 1C, CNTs 7 are grown in the via hole 11 using a plasma CVD method. The discontinuous catalyst layer 6 including islands is previously formed on the bottom face of the via hole 11, and the CNTs 7 grows on the respective islands, thereby allowing it to acquire columnar CNTs 7. The surface density of the islands is about $10^{12}/cm^2$, for example. A plasma CVD method is used to grow CNTs 7 on the islands. A methane gas ($CH_4$) is employed as a raw material gas and a hydrogen gas ($H_2$) is employed as a dilution gas. The raw material gas and the dilution gas are not limited to these, but hydrocarbon gases, such as ethylene gas ($C_2H_4$), acetylene gas ($C_2H_2$) etc., may be employed for the raw material gas. An inert gas, such as helium (He), nitrogen ($N_2$), argon (Ar) etc., may be employed for the dilution gas. Or only the raw material gas may be used sufficiently. The temperature of the substrate 1 is in a range from 400° C. to 600° C., and the reaction pressure for the CVD method is 5 Torr, whereas CNTs 7 can grow also in other conditions.

In addition, as shown in FIG. 1C, the catalyst layers 5, 6 are removed from the field region and the side wall of the via hole 11, thereby allowing CNTs 7 to grow only on the bottom face of the via hole. In addition, the discontinuous catalyst layer 6 including islands is formed on the bottom face of the via hole 11, thereby allowing many columnar CNTs 7 to grow from the bottom face of the via hole 11 in the direction vertical to the bottom face thereof. Each of CNTs 7 connects electrically the lower layer wiring 2 in the substrate 1 to the upper wiring 9 which will be shown in FIG. 2L. A "bundle of CNTs 7" which is an aggregate of CNTs serves as a via wiring layer. FIG. 1C is a view showing a manufacturing step where the growth of CNTs 7 is completed in the via hole 11. When the depth of the via hole 11 is set to about 120 nm, for example, the growth time is controlled so that CNTs 7 project from the surface of the interlayer insulating film 3 by about 50 nm.

Next, the bundle of CNTs 7 grows in the via hole to be followed by the fluorination treatment for the entire surface of the substrate 1 having the interlayer insulating film 3, etc. as shown in FIG. 1D. The fluorination treatment means a plasma treatment to chemically modify the surface of the field region or the substrate 1 with a fluoro-system gas, such as a carbon tetrafluoride ($CF_4$) gas. Here, the gas for the plasma treatment is not limited to the above-mentioned gas, and examples of the gas include carbon-fluorine compound such as methane trifluoride ($CHF_3$) and hexafluoroethane ($C_2F_6$), or nitrogen-fluorine compound such as nitrogen trifluoride ($NF_3$). In addition, the examples may also include a mixed gas including a dilution gas such as argon (Ar) or nitrogen ($N_2$).

The fluorination treatment gives a water-repellent characteristic or an oil-repellent one to the field region on the interlayer insulating film 3. This fluorination treatment is a pretreatment to prevent the field region from being coated with SOG (Spin On Glass) in the subsequent process, i.e., in a post-process to form an embedded film. As shown in FIG. 1D, although the portions of CNTs 7 projecting from the inside of the via hole 11 are exposed to plasma, the rest of the potions inside the via hole 11 undergoes no change or less change caused by the plasma as a result of the densely grown CNTs 7. FIG. 1D is a schematic view showing a manufacturing step where the field region on the interlayer insulating film 3 and the portions of CNTs 7 projecting from the via hole 11 are exposed to the plasma.

The next step is to form an embedded film 8 in the via hole 11 shown in FIG. 1E and to fix the via hole 11 including CNTs 7 therewith. A $SiO_2$ system film, such as liquid SOG, is used for the embedded film 8 as mentioned above. As a coating method of SOG, SOG is dropped on the surface of the substrate 1 to coat the substrate 1 therewith using a spin coater, and is then heated to be cured. Alternatively, ultraviolet curable SOG may be applied entirely to the substrate 1 to form the embedded film 8.

In the conventional example, there was a possibility that the field region locally lacked the SOG embedded film 8. However, in the present embodiment, the entire field region undergoes the fluorination treatment to eliminate the embedded film 8 therefrom, thereby allowing the embedded film 8 to be formed just within the via hole 11 having CNTs 7 therein. The projecting portion of CNTs 7 is given a water-repellent characteristic or a oil-repellent characteristic due to the fluorination treatment, whereas the portion of CNTs 7 inside the via hole has a less or no repellent characteristic due to the fluorination treatment, thereby allowing SOG with a high specific weight to penetrate into the clearance gaps of the bundle of CNTs 7 in the via hole 11.

As mentioned above, the clearance gaps among CNTs 7 are filled with SOG to be cured. Then, CNTs 7 is fixed by the embedded film 8 including $SiO_2$. FIG. 1E is a schematic view showing a manufacturing step where CNTs 7 are fixed by the embedded film 8 in the via hole 11.

After the embedded film 8 is formed as described above, the substrate undergoes a CMP (CHEMICAL MECHANICAL POLISHING) treatment to be flattened so that the upper portion of CNTs 7 projecting from the via hole is removed. FIG. 1F is a schematic view showing a substrate having undergone the CMP treatment. As shown in FIG. 1F, the field region is polished uniformly with the CMP treatment, and CNTs 7 projecting from the via hole 11 are polished along with the embedded film 8 including $SiO_2$ simultaneously. Thereby, the surface of the substrate is entirely flattened, and CNTs 7 are in the "open end" state as shown in FIG. 6B.

If CNTs 7 with their ends closed are used for the via wiring, CNTs 7 in the present embodiment include MW (Multi-walled) CNTs which include two or more graphen sheets, and all the graphen sheets close their top ends as shown in FIG. 6A. When an upper electrode is formed on the closed top ends of CNTs 7, only outermost sheets of MWCNTs 7 can contribute to electric conduction, thereby making it difficult to acquire a high current capacity inherent to the MWCNTs.

On the other hand, as shown in FIG. 1F, after fixing MWCNTs 7 with the embedded film 8, the upper ends of MWCNTs 7 are cut by CMP. This allows not only the outermost graphen sheets but also the inner graphen sheets to contribute to electric conduction into the upper electrode. Consequently, a high current capacity inherent to CNTs can be acquired. As mentioned above, the upper portions of CNTs 7 are cut to make their ends open, thereby allowing it to acquire both the high current capacity and the flatness of the interlayer insulating film 3 of the field region.

As shown in FIG. 1G, the upper electrode 9 is formed on the via wiring which is flattened using CMP. A laminated structure of a titanium (Ti) layer and an aluminum (Al) layer, or a Ti or Al single layer, or other metallic materials are employed for the upper electrode 9. The upper electrode 9 is finally formed using a sputter method or a vacuum deposition method, thereby completing the semiconductor substrate. FIG. 1G is a schematic view showing a step where CNTs 7 fill the via wiring with the embedded film 8 and the upper electrode 9 is formed on CNTs 7 which are fixed and flattened.

As described above, according to the first embodiment, in the manufacturing method of the semiconductor substrate, the fluorination plasma treatment prevents the embedded film 8 from being formed on the interlayer insulating film 3 in the field region. This also prevents the interlayer insulating film 3 in the field region from being polished locally and non-uniformly during CMP. Therefore, it will never happen that the lower wiring layer 2 and the upper electrode 9 will short out as a result of an interlayer insulating film 3 polished locally and non-uniformly. This also allows it to avoid an undesirable phenomenon that the CNT via wiring does not serve as wiring, i.e., an yield reduction of semiconductor substrates.

Second Embodiment

FIGS. 2A to 2L are views showing manufacturing steps of a semiconductor substrate according to a second embodiment.

The second embodiment differs from the first embodiment in that the barrier metal layer 4, the catalyst layers 5 and 6 are formed before forming the interlayer insulating film 3 as will be shown later in FIG. 2I. In the second embodiment, the interlayer insulating film 3 in the field region lacks the barrier metal layer 4, the catalyst layers 5 and 6 from the beginning of the manufacturing steps. Therefore, ion milling is not needed to remove these layers 4, 5 and 6 from the field region. Steps similar to those in the first embodiment except ion milling are followed in the second embodiment.

FIG. 2A is a view showing a semiconductor substrate 1 with a lower wiring layer 2 formed previously. The barrier metal layer 4, the catalyst layers 5 and 6 are formed in series on the whole surface of the substrate 1 with the lower wiring layer 2 formed previously as shown in FIG. 2B. Being taken out from a deposition chamber, the substrate 1 is entirely coated with resist 12. An area for a via hole to be formed is exposed to, e.g., ultraviolet. Then, the substrate 1 is developed and the resist 13 is left in the area for the via hole to be formed as shown in FIG. 2E.

Next, Ar-ion milling is carried out on the developed substrate 1 to leave the catalyst layers 5, 6 only on the bottom face of the via hole. The ion-milling removes all the catalyst layers 5, 6 from the entire field region excepting the area for the via hole to be formed, as shown in FIG. 2G. An SiOC film, for example, is formed as the interlayer insulating film 3 on the substrate 1 where the catalyst layers 5, 6 have been previously removed from the field region thereof and have been left on the area for the via hole to be formed as shown in FIG. 2H. A plasma CVD method using organic silane and $N_2O$ (or $O_2$) as raw materials is employed to form the SiOC film. After forming the SiOC film, the resist layer 13 is removed with organic solvent such as acetone, for example, to provide the semiconductor substrate 1 on which the via hole 11 is formed and the catalyst layers 5, 6 have been formed on the bottom face thereof.

The second embodiment lacks the manufacturing steps to form the catalyst layers 5, 6 into the concave via hole 11 by sputtering, thereby allowing the catalyst layers 5, 6 to be remarkably uniform within the bottom face of the via hole 11. When the catalyst layers 5, 6 are formed in the concave via hole 11, constituent atoms of the catalyst layers 5, 6 tend to gather preferentially at the edge portion where the bottom face and the side wall of the via hole 11 are normal to each other, thereby starting to form islands to be a continuous film later. In other words, there may be a case that the initial growth mode of the catalyst layer at the center of the bottom face is different from that at the edge portion of the bottom face. Therefore, the formed catalyst layers may be non-uniform depending on the sputtering conditions when the catalyst layers are formed in such a concave via hole. Regarding this point, the catalyst layers are formed uniformly on the whole semiconductor substrate 1 before forming the via hole in the second embodiment, thereby allowing the catalyst layers to be remarkably uniform on the entire bottom face of the via hole 11.

In addition, the catalyst layers 5, 6 are not formed at all on the side face of the via hole 11. Accordingly, in the second embodiment, when CNTs 7 are subsequently grown on the semiconductor substrate 1, CNTs 7 can grow uniformly just within the via hole 11, specifically on the bottom face thereof only. The uniform catalyst layers 5, 6 prompt the uniform growth of CNTs 7 in the second embodiment. As shown in FIGS. 2J to 2M, after forming CNTs 7, the fluorination treatment is performed to the entire substrate 1 the same way as in the first embodiment (FIG. 2K). Subsequently, SOG is applied to penetrate the clearance gaps among CNTs 7 in the via hole 11, and is dried or irradiated with ultraviolet so that SOG is cured to be the embedded film 8, thereby fixing CNTs 7 (FIG. 2L) in the via hole 11. Then, the entire substrate 1 undergoes a CMP treatment to open the ends of CNTs 7 to provide a structure where CNTs 7 have been buried in the via hole 11 and the upper electrode 11 has been prepared thereon (FIG. 2M).

In the second embodiment, the ion milling for the field region can be omitted, thereby allowing it to reduce ion damage to the surface of the field region. This enhances the effect of the fluorination treatment. As a result, the embedded film 8 is not formed in the field region at all. Thereby, CMP treatment does not cause the interlayer insulating film 3 to be polished locally and non-uniformly. Also will not cause the upper electrode 9 to reach the lower layer wiring 2 so that the upper electrode 9 and the lower layer wiring 2 do not short out. In other words, this allows it to avoid an undesirable phenomenon that the CNT via wiring does not serve as wiring, i.e., an yield reduction of semiconductor substrates.

Third Embodiment

A third embodiment will be described with reference to FIG. 3. The third embodiment differs from the first and second embodiments only in steps for the fluorination treatment, shown in FIG. 1D for the first embodiment and shown in FIG. 2K for the second embodiment. The third embodiment does not employ the plasma treatment of fluorine system gases as shown in FIG. 1D and FIG. 2K, but a spray or a flow of the gases onto the substrate 1 to fluorinate the surface thereof as shown in FIG. 3.

The fluorination treatment of the surface of the interlayer insulating film 3 due to the fluorine gas flow prevents the embedded film 8 from being formed in the field region of the substrate 1, i.e., on the interlayer insulating film 3. This also prevents the interlayer insulating film 3 in the field region from being polished locally and non-uniformly during CMP. As a result, the field region of the substrate 1 is not coated with the embedded film 8 as mentioned in the first and second embodiments, whereas liquid SOG penetrates the bundle of CNTs 7 grown in the via hole 11.

In the present embodiment, the effect of the fluorination treatment for the CNTs 7 is a little weaker than that of the fluorination treatment in the first and second embodiments, thereby allowing liquid SOG to penetrate the bundle of CNTs 7 grown in the via hole 11 more easily. Accordingly, in the third embodiment, the bundle of CNTs 7 is fixed more tightly and uniformly by the embedded film 8. As a result, CNTs 7 can undergo the CMP treatment to open the ends of CNTs 7 more uniformly, thereby allowing CNTs to serve more remarkably as wiring.

In the third embodiment, the fluorination treatment prevents the embedded film 8 from being formed in the field region of the substrate 1, i.e., on the interlayer insulating film 3. This also prevents the interlayer insulating film 3 from being polished locally and non-uniformly during CMP. Therefore, it will never happen that the lower wiring layer 2 and the upper electrode 9 will short out as a result of the interlayer insulating film 3 polished locally and non-uniformly. This also allows it to avoid an undesirable phenomenon that the CNT via wiring does not serve as wiring, i.e., an yield reduction of semiconductor substrates.

While certain embodiments have been described above, these embodiments have been presented by way of example only, and are not intended to limit the scope of the inventions. Indeed, the novel methods described herein may be embodied in a variety of the other forms; furthermore, various omissions, substitutions and changes in the embodiments of the methods described herein may be made without departing from the spirit of the inventions or the technical ideas. The accompanying claims and their equivalents are intended to cover such forms or modifications as would fall within the scope and spirit of the inventions or the technical ideas.

What is claimed is:

1. A manufacturing method of a semiconductor substrate, comprising:

forming a first wiring layer on a substrate;
forming an interlayer insulating film having a via hole on the wiring layer;
forming carbon nanotubes in the via hole;
performing a fluorination treatment entirely to the substrate such that portions of the nanotubes in the via hole remain without fluorine treatment;
forming an embedded film in the via hole having the carbon nanotubes therein; and
polishing the substrate to entirely flatten the substrate.

2. The method according to claim 1, wherein the carbon nanotubes are grown using a vapor-phase method.

3. The method according to claim 2, wherein the vapor-phase method employs a plasma including at least a hydrocarbon gas.

4. The method according to claim 1, wherein a catalyst layer exists between the carbon nanotubes and the first wiring layer.

5. The method according to claim 4, wherein the catalyst layer includes any one of cobalt, nickel and iron or an alloy including any one of cobalt, nickel and iron.

6. The method according to claim 1, wherein the fluorination treatment employs a plasma including at least a hydrocarbon gas.

7. The method according to claim 1, wherein a gas including at least fluorine is sprayed or flown entirely onto the substrate to perform the fluorination treatment.

8. The method according to claim 1, wherein the substrate is coated with a thermally curable material to form the embedded film by heating.

9. The method according to claim 1, wherein the substrate is coated with an ultraviolet curable material to form the embedded film by heating.

* * * * *